(12) United States Patent
Choi et al.

(10) Patent No.: US 10,361,259 B2
(45) Date of Patent: Jul. 23, 2019

(54) ORGANIC LIGHT EMITTING DISPLAY DEVICE HAVING A THIN FILM ENCAPSULATION PART HAVING AN ORGANIC FILM AND AN INORGANIC FILM

(71) Applicant: SAMSUNG DISPLAY CO., LTD., Yongin-si, Gyeonggi-do (KR)

(72) Inventors: Chungsock Choi, Seoul (KR); Sanghwan Cho, Suwon-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/628,702

(22) Filed: Jun. 21, 2017

(65) Prior Publication Data

US 2018/0047800 A1   Feb. 15, 2018

(30) Foreign Application Priority Data

Aug. 12, 2016 (KR) .................. 10-2016-0103262

(51) Int. Cl.
  *H01L 27/32* (2006.01)
  *G09G 3/3233* (2016.01)
  *H01L 51/52* (2006.01)

(52) U.S. Cl.
  CPC ....... *H01L 27/3258* (2013.01); *G09G 3/3233* (2013.01); *H01L 27/322* (2013.01); *H01L 51/5253* (2013.01); *G09G 2300/0421* (2013.01); *H01L 51/5234* (2013.01); *H01L 51/5275* (2013.01); *H01L 2251/5369* (2013.01)

(58) Field of Classification Search
  CPC ............ H01L 27/3258; H01L 51/5234; H01L 51/5275; G09G 3/3233; G09G 2300/0421
  See application file for complete search history.

(56) References Cited

U.S. PATENT DOCUMENTS

| 9,035,291 B2 * | 5/2015 | Kim .................... H01L 51/5256 257/40 |
| 9,806,275 B2 * | 10/2017 | Jung ................... H01L 51/5036 |
| 2009/0085477 A1 * | 4/2009 | Hwang ............... H01L 51/5265 313/504 |

(Continued)

FOREIGN PATENT DOCUMENTS

| KR | 10-2005-0033984 A | 4/2005 |
| KR | 10-0873082 B1 | 12/2008 |

(Continued)

*Primary Examiner* — Tracie Y Green
(74) *Attorney, Agent, or Firm* — Lee & Morse, P.C.

(57) ABSTRACT

Provided is an organic light emitting display device including a base substrate, a pixel layer, a quantum dot layer, and a thin film encapsulation part. The pixel layer includes a plurality of organic light emitting diodes on the base substrate. The quantum dot layer includes quantum dots on the pixel layer. The thin film encapsulation part is between the quantum dot layer and the pixel layer, and seals the pixel layer. The thin film encapsulation part includes a first inorganic film and an organic film. The first inorganic film has a plurality of first auxiliary films, each having a first refractive index, and a plurality of second auxiliary films, each having a second refractive index that differs from the first refractive index, alternately stacked with the plurality of first auxiliary films along a thickness direction of the base substrate.

21 Claims, 13 Drawing Sheets

(56) References Cited

U.S. PATENT DOCUMENTS

| | | | |
|---|---|---|---|
| 2014/0042467 A1* | 2/2014 | Livesay | H01L 33/642 257/88 |
| 2015/0102291 A1* | 4/2015 | Park | H01L 27/3216 257/40 |
| 2015/0115235 A1* | 4/2015 | Lee | H01L 51/5253 257/40 |
| 2016/0028035 A1* | 1/2016 | Yang | H01L 51/502 257/40 |
| 2016/0141540 A1* | 5/2016 | Jung | H01L 51/5036 257/40 |
| 2016/0365699 A1* | 12/2016 | Lell | H01S 5/028 |
| 2017/0110518 A1* | 4/2017 | Lee | H01L 27/322 |
| 2018/0175316 A1* | 6/2018 | Chen | H01L 51/502 |
| 2018/0190929 A1* | 7/2018 | Koch | H01L 51/5265 |

FOREIGN PATENT DOCUMENTS

| | | |
|---|---|---|
| KR | 10-2014-0042274 A | 4/2014 |
| KR | 10-1676291 B1 | 11/2016 |

\* cited by examiner ated to as being 'above' or 'on' another film, region, element, etc., it -->

ORGANIC LIGHT EMITTING DISPLAY DEVICE HAVING A THIN FILM ENCAPSULATION PART HAVING AN ORGANIC FILM AND AN INORGANIC FILM

CROSS-REFERENCE TO RELATED APPLICATION

Korean Patent Application No. 10-2016-0103262, filed on Aug. 12, 2016, in the Korean Intellectual Property Office, and entitled: "Organic Light Emitting Display Device," is incorporated by reference herein in its entirety.

BACKGROUND

1. Field

The present disclosure relates to an organic light emitting display device, and, more particularly, to a display device having improved display quality.

2. Description of the Related Art

Organic light emitting display devices a type of flat display device in which organic light emitting diodes arranged on each of a plurality of pixels and emitting light are used to display an image. Such an organic light emitting diode includes an anode, a cathode, and an organic light emitting layer between the anode and the cathode.

When a power signal is applied to the organic light emitting diode, holes are supplied to the organic light emitting layer through the anode, and electrons are supplied to the organic light emitting layer through the cathode. The electrons and holes in the organic light emitting layer are recombined to generate excitons, and the energy generated due to the conversion of excitons from an excited state to a ground state causes light to be generated from the organic light emitting layer.

SUMMARY

An embodiment provides an organic light emitting display device including a base substrate, a pixel layer, a quantum dot layer, and a thin film encapsulation part. The pixel layer includes a plurality of organic light emitting diodes on the base substrate. The quantum dot layer includes quantum dots on the pixel layer. The thin film encapsulation part is between the quantum dot layer and the pixel layer, and seals the pixel layer.

The thin film encapsulation part includes a first inorganic film and an organic film. The first inorganic film has a plurality of first auxiliary films, each having a first refractive index, and a plurality of second auxiliary films, each having a second refractive index that differs from the first refractive index. The plurality of second auxiliary films may be alternately stacked with the plurality of first auxiliary films in a thickness direction of the base substrate.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
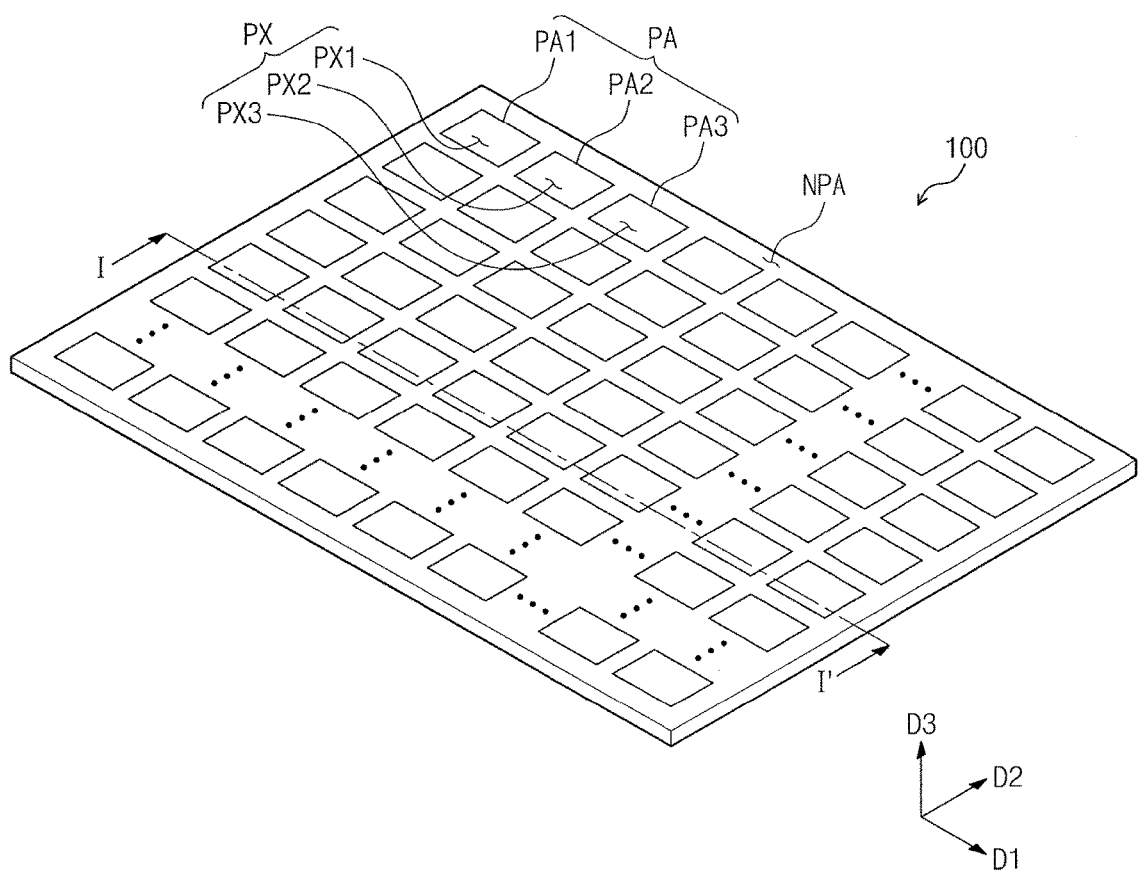
FIG. 1A illustrates a perspective view of an organic light emitting display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Moreover, although the terms 'first', 'second', etc. may be used herein to describe various elements, these elements should not be limited by these terms. These terms are only used to distinguish one element from another element. In addition, when a film, region, element, etc. is referred to as being 'above' or 'on' another film, region, element, etc., it can be directly 'above' or 'on' the other film, region, element, etc., or intervening film, region, element, etc. may also be present.

Figure 1B:
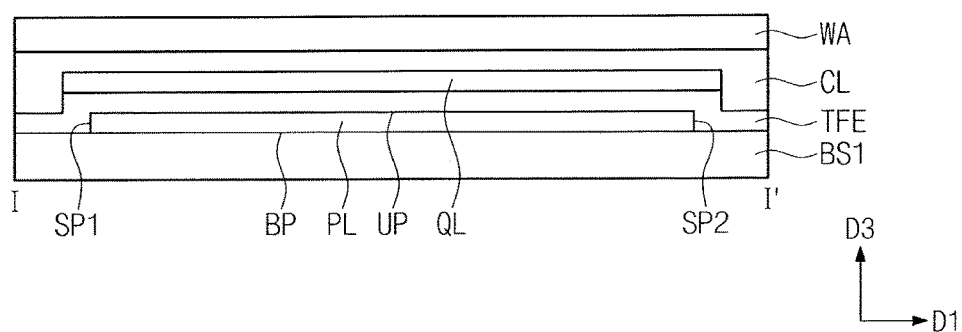
FIG. 1B illustrates a cross-sectional view along I-I' in FIG. 1A.

FIG. 1A is a perspective view of an organic light emitting display device 100 according to an embodiment, and FIG. 1B is a cross-sectional view along I-I' in FIG. 1A. Referring to FIGS. 1A and 1B, an organic light emitting display device 100 includes a base substrate BS1, a pixel layer PL, a thin film encapsulation part TFE, a quantum dot layer QL, a cover layer CL, and a window assembly WA.

The base substrate BS1 is transmissive, and a plurality of pixel areas PA and non-pixel areas NPA may be defined in the base substrate BS1. In an embodiment, the base substrate BS1 may be a glass substrate or a plastic substrate. When the base substrate BS1 is the plastic substrate, the base substrate BS1 may be flexible.

The pixel layer PL is disposed on the base substrate BS1 and emits light used for displaying an image in the organic light emitting display device 100. The pixel layer PL may include a plurality of pixels PX. The plurality of pixels PX may be arranged so as to correspond one-to-one with the plurality of pixel areas PA.

For example, the plurality of pixel areas PA may include a first pixel area PA1, a second pixel area PA2, and a third pixel area PA3 sequentially arranged in a first direction D1. The plurality of pixels PX may include a first pixel PX1 disposed in the first pixel area PA1, a second pixel PX2 disposed in the second pixel area PA2, and a third pixel PX3 disposed in the third pixel area PA3. In an embodiment, the plurality of pixels PX may be arranged in a matrix along the first direction D1 and a second direction D2 perpendicular to the first direction D1.

The thin film encapsulation part TFE may be disposed on the base substrate BS1 and covers the pixel layer PL. Thus, the thin film encapsulation part TFE, together with the base substrate BS1, seals the pixel layer PL.

In more detail, the thin film encapsulation part TFE covers a top part UP of the pixel layer PL, and the base substrate BS1 covers a bottom part BP of the pixel layer PL. The thin film encapsulation part TFE may extend further toward both sides of the base substrate BS1 than does the pixel layer PL. In other words, the thin film encapsulation part TFE may extend further in the first direction than the pixel layer PL and may extend in a third direction D3 along sides of the pixel layer to contact the base substrate BS1. Therefore, since mutually facing first and second side parts SP1 and SP2 of the pixel layer PL are covered by the thin film encapsulation part TFE, and the base substrate BS1 and the thin film encapsulation part TFE surround the pixel layer PL, the pixel layer PL may be sealed. Alternatively, the base substrate BS1 may extend in the third direction along side parts SP1 and SP2 of the pixel layer PL to seal the pixel layer.

The quantum dot layer QL may be disposed above the pixel layer PL with the thin film encapsulation part TFE disposed therebetween. The quantum dot layer QL may include quantum dots (QD1 and QD2 in FIG. 4B). The quantum dot layer QL converts the wavelength of light provided from the pixel layer PL. Thus, the quantum dot layer QL may cause colored light to be output from the plurality of pixel areas PA.

The cover layer CL may be on and cover the quantum dot layer QL. In an embodiment, the cover layer CL may include polymer materials. The cover layer CL is transmissive and protects the quantum dot layer QL. The cover layer CL may provide a flat face to the top side such that elements disposed above the quantum dot layer QL may be stably disposed on the flat face provided by the cover layer CL. The cover layer CL may extend along the sides of the quantum dot layer QL in third direction and may contact the thin film encapsulation part TFE.

The window assembly WA is disposed on the cover layer CL. In an embodiment, an adhesive layer may be further disposed on the cover layer CL, and the window assembly WA may be adhered by the adhesive layer to a display panel assembly having the base substrate BS1, the pixel layer PL, the thin film encapsulation part TFE, and the cover layer CL. In the organic light emitting display device 100, the window assembly WA is disposed on the uppermost layer and thus exposed to the outside, and covers the pixel layer PL and the quantum dot layer QL.

In an embodiment, the window assembly WA may include a transmissive window and a touch sensing unit overlapping the window. The touch sensing unit, together with a touchscreen panel, may generate data about the coordinates of a user-touched position on the window.

Figure 2A:
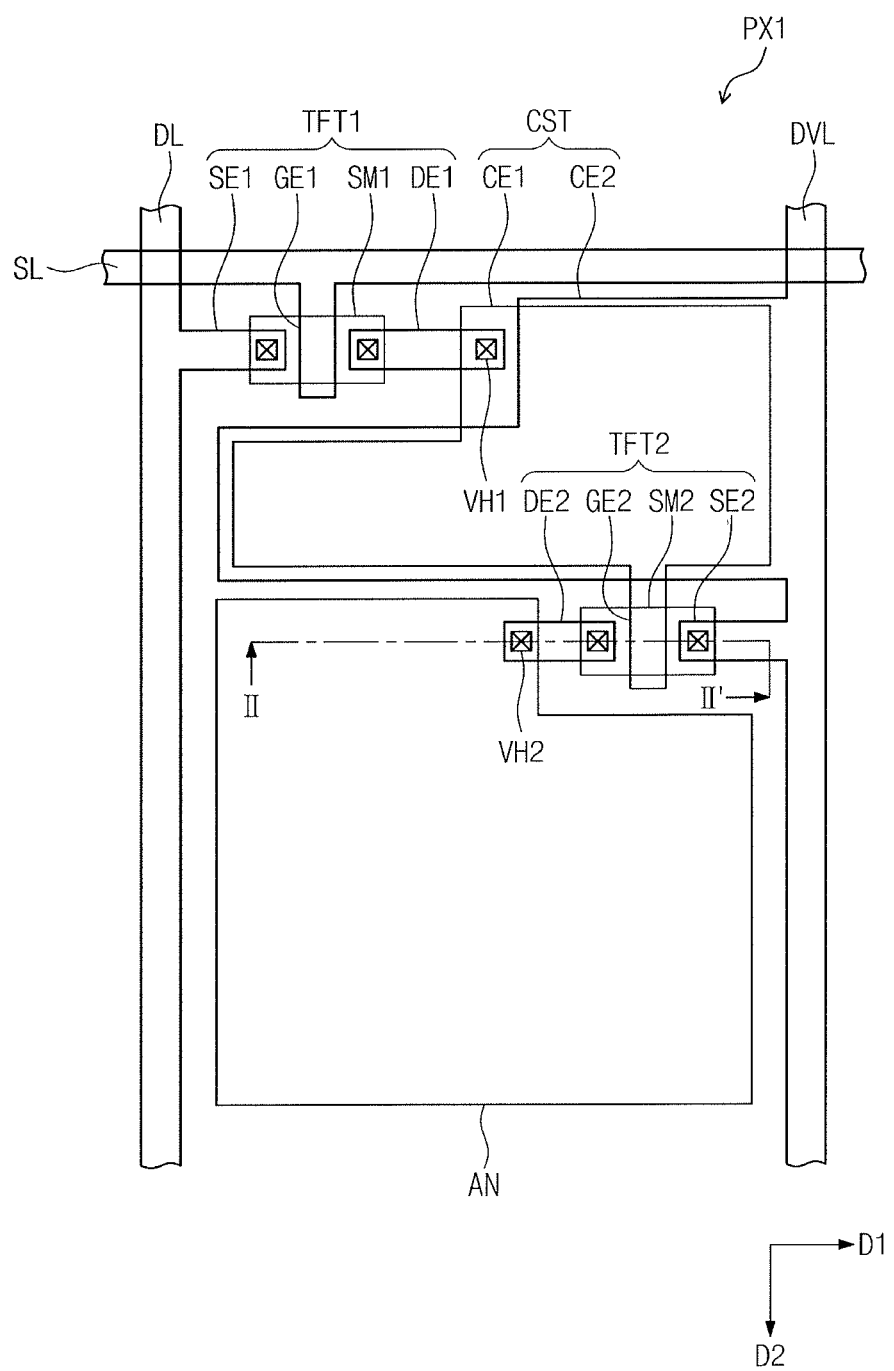
FIG. 2A illustrates a plan view of a first pixel in a pixel layer in FIGS. 1A and 1B.
Figure 2B:
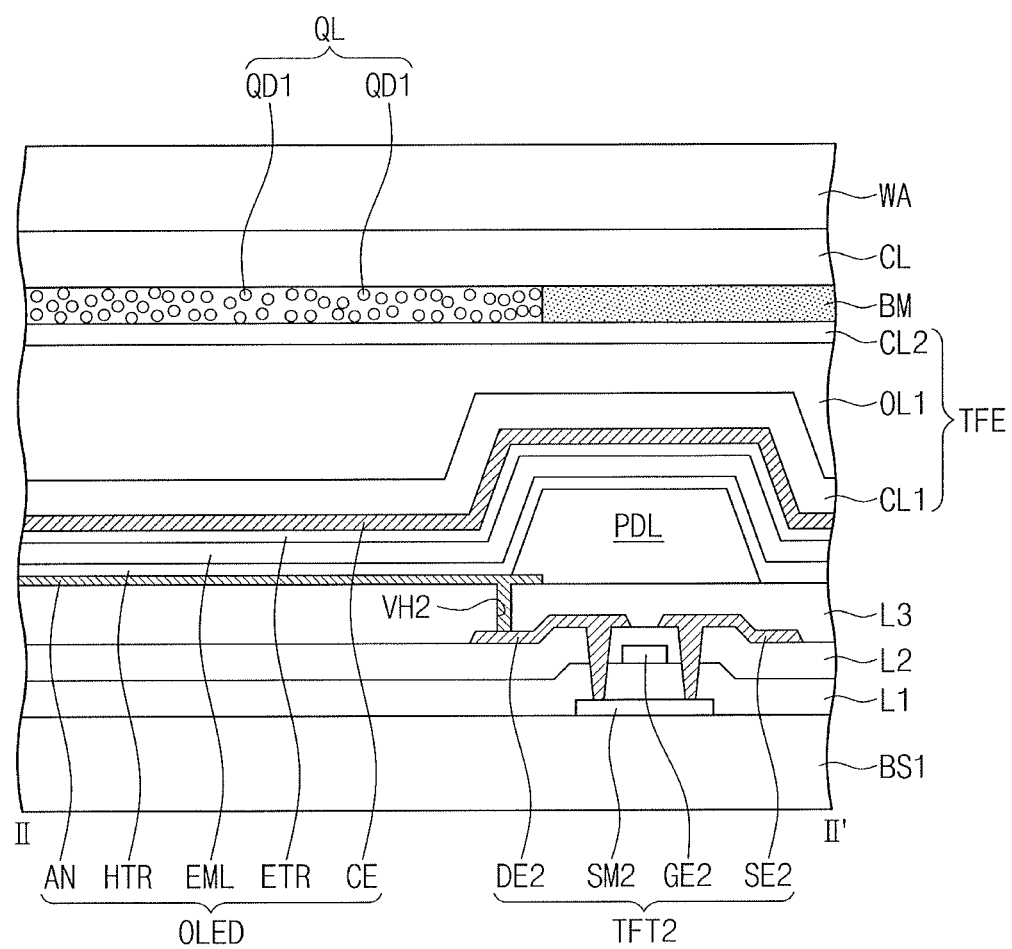
FIG. 2B illustrates a cross-sectional view along II-II' in FIG. 2A.

FIG. 2A is a plan view of a first pixel PX1 in a pixel layer PL illustrated in FIGS. 1A and 1B, and 2B is a cross-sectional view along II-II' in FIG. 2A. In an embodiment, the plurality of pixels (PX in FIG. 1A) may share the same structure, other than the quantum dot layer QL, and, thus, with reference to FIGS. 1A, 2A, and 2B, the structure of the first pixel PX1 among the plurality of pixels, and the structure of the elements in the vicinity of the first pixel PX1 will be exemplarily described, whereas descriptions of the other pixels will be excluded. Only details of the quantum dot layer may differs between the plurality of pixels.

Referring to FIGS. 2A and 2B, a gate line SL, a data line DL, a power signal line DVL, a switching transistor TFT1, a driving transistor TFT2, a storage capacitor CST, and an organic light emitting diode OLED are disposed in the first pixel PX1 of the organic light emitting display device 100.

The gate line SL may be disposed on the base substrate BS1 and transmits a gate signal. The data line DL is insulated from the gate line SL, disposed on the base substrate BS1, and transmits a data signal. In an embodiment, the gate line SL may extend in the first direction D and the data line DL may extend in the second direction D2.

The switching transistor TFT1 is electrically connected with the gate line SL and the data line DL. The switching transistor TFT1 is provided with the gate signal through the gate line SL and the data signal through the data line DL. The switching transistor TFT1 may include a first semiconductor pattern SM1, a first gate electrode GE1, a first source electrode SE1, and a first drain electrode DE1.

The first semiconductor pattern SM1 may include a semiconductor material. In an embodiment, a composition material of the first semiconductor pattern SM1 may include polycrystalline silicon. However, embodiments are not limited to a particular semiconductor material of the first semiconductor pattern SM1. For example, in another embodiment the first semiconductor pattern SM1 may include an oxide semiconductor, e.g., indium gallium zinc oxide (IGZO), zinc oxide (ZnO), tin oxide ($SnO_2$), indium oxide ($In_2O_3$), zinc tin oxide ($Zn_2SnO_4$), germanium oxide ($Ge_2O_3$), or hafnium oxide ($HfO_2$). In still another embodiment, the first semiconductor pattern SM1 may include a compound semiconductor, e.g., gallium arsenide (GsAs), gallium phosphide (GaP), or indium phosphide (InP). In a still further embodiment, the first semiconductor SM1 may include an amorphous silicon.

The first gate electrode GE1 is connected with the gate line SL and overlaps the first semiconductor pattern SM1, e.g., along the second and third directions. The first source electrode SE1 is connected with the data line DL and contacts a source area of the first semiconductor pattern SM1. The first drain electrode DE1 contacts a drain area of the first semiconductor pattern SM1 and is connected with the storage capacitance CST.

The storage capacitance CST includes a first storage electrode CE1 and a second storage electrode CE2 that overlap each other. The first storage electrode CE1 is connected with the first drain electrode DE1 through a first via hole VH1. At least one of a gate insulating film L1 or an intermediate insulating film L2 may be disposed between the first storage electrode CE1 and the second storage electrode CE2.

The first storage electrode CE1 is connected with the first drain electrode DE1 and the second storage electrode CE2 is connected with the power signal line DVL. Thus, an electric charge, in an amount corresponding to the voltage difference between a voltage, which corresponds to the data signal received from the switching transistor TFT1, and a voltage, which corresponds to a power signal received from the power signal line DVL, is charged into the storage capacitor. The charged amount of electric charge may be supplied to the driving transistor TFT2 side while the switching transistor TFT1 is turned off.

The driving transistor TFT2 is electrically connected with the switching transistor TFT1, the power signal line DVL, and the organic light emitting diode OLED, and switches a power signal provided from the power signal line DVL to the organic light emitting diode OLED side. The driving transistor TFT2 may include a second semiconductor pattern SM2, a second gate electrode GE2, a second source electrode SE2, and a second drain electrode DE2.

The second gate electrode GE2 is connected with the first drain electrode DE1 through the first storage electrode CE1, and the second source electrode SE2 is connected with the power signal line DVL. The second drain electrode DE2 is connected with the organic light emitting diode OLED through a second via hole VH2 defined in a cover insulating film L3.

The gate insulating film L1 covers the second semiconductor pattern SM2. The intermediate insulating film L2 is disposed on the gate insulating film L1 and covers the second gate electrode GE2. The cover insulating film L3 is disposed on the intermediate insulating film L2 and covers the second source electrode SE2 and the second drain electrode DE2.

The organic light emitting diode OLED emits light in response to the power signal provided through the driving transistor TFT2. In an embodiment, the organic light emitting diode OLED includes an anode AN, a hole control layer HTR, an organic light emitting layer EML, an electron control layer ETR, and a cathode CE.

The anode AN is disposed on the cover insulating film L3, and is connected with the second drain electrode DE2 through the second via hole VH2 which passes through the cover insulating film L3. In an embodiment, the anode AN may be a reflective electrode, in which case the anode AN may be a metal layer including a metal, e.g., silver (Ag), magnesium (Mg), aluminum (Al), platinum (Pt), palladium (Pd), gold (Au), nickel (Ni), neodymium (Nd), iridium (Ir), or chrome (Cr). In another embodiment, the anode AN may further include a metal oxide layer disposed on the metal layer. For example, the anode AN may have a double-layered structure such as indium tin oxide (ITO)/Mg or ITO/MgF, or a multilayered structure such as ITO/Ag/ITO.

A pixel defining film PDL is disposed on the anode AN. An opening that corresponds to the position of the anode AN is defined in the pixel defining film PDL, and the organic light emitting layer EML may contact the anode AN through the opening in the pixel defining film PDL.

In an embodiment, the hole control layer HTR may include a hole injection layer and a hole transport layer. In another embodiment, the hole control layer HTR may further include at least one of a hole buffer layer or an electron blocking layer.

In an embodiment, the hole injection layer may include a hole injection material, which may include a phthalocyanine compound, e.g., copper phthalocyanine or N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4'4"-Tris(N,N-diphenylamino)triphenylamine (TDATA), 4,4',4"-tris{N,-(2-naphthyl)-N-phenylamino}-triphenylamine (2-TNATA), Poly(3,4-ethylenedioxythiophene)/Poly(4-styrenesulfonate (PEDOT/PSS), Polyaniline/Dodecylbenzenesulfonic acid (PANI/DBSA), Polyaniline/Camphor sulfonicacid (PANI/CSA), (Polyaniline)/Poly(4-styrenesulfonate) (PANI/PSS), and the like. However, embodiments of are not limited to particular hole injection materials.

In an embodiment, the hole injection layer may further include a charge generating material in order to improve the conductivity of the hole control layer HTR. The charge generating material may be a p-type dopant, and the p-type dopant may be one of a quinone derivative, a metal oxide, or a cyano group-containing compound, but embodiments are not limited to particular p-type dopants. For example, in another embodiment, the p-type dopant may also include a quinone derivative, e.g., Tetracyanoquinodimethane (TCNQ) or 2,3,5,6-tetrafluoro-tetracyanoquinodimethane (F4-TCNQ), or a metal oxide such as tungsten oxide or molybdenum oxide.

The hole transport layer includes a hole transport material. The hole transport material may include a carbazole-based derivative such as N-phenylcarbazole or polyvinylcarbazole, a fluorene-based derivative, a triphenylamine-based derivative, e.g., N,N'-bis(3-methylphenyl)-N,N'-diphenyl-[1,1-biphenyl]-4,4'-diamine (TPD) or 4,4',4"-tris (N-carbazolyl)triphenylamine (TCTA), or N,N'-di(1-naphthyl)-N,N'-diphenylbenzidine (NPB), 4,4'-Cyclohexylidene bis[N,N-bis(4-methylphenyl) benzenamine] (TAPC), and the like. However, embodiments are not limited to particular hole transport layer materials.

The organic light emitting layer EML is disposed on the hole control layer HTR. In an embodiment, the organic light emitting layer EML may emit a blue light and My be a continuous film formed along the plurality of pixel areas PA and non-pixel areas NPA.

In an embodiment, the organic light emitting display device 100 may be a top emission type. Accordingly, the blue light output from the organic light emitting layer EML may be provided to the quantum dot layer QL after passing through the cathode CE, and the blue light provided to the quantum dot layer QL may be converted by the quantum dot layer QL into a light having a different color from the blue light.

The electron control layer ETR may include an electron transport layer and an electron injection layer. In an embodiment, the electron control layer ETR may have a structure in which the electron transport layer is laminated with the electron injection layer. In another embodiment, the electron injection layer may be excluded from the electron control layer ETR.

The electron transport layer may include an electron transport material, e.g., Tris(8-hydroxyquinolinato)aluminum (Alq3), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate (Bebq2), 9,10-di(naphthalene-2-yl)anthracene (ADN), or mixtures thereof. However, embodiments are not limited to particular electron transport materials.

The electron injection layer includes an electron injection material, e.g., lithium fluoride (LiF), lithium quinolate (LiQ), lithium oxide ($Li_2O$), barium oxide (BaO), sodium chloride (NaCl), cesium fluoride (CsF), a lanthanum group metal such as ytterbium (Yb), a halogenated metal such as rubidium chloride (RbCl) or rubidium iodide (RbI), and the like. However, embodiments are not limited to particular electron injection materials. For example, in another embodiment, the electron injection layer may include a mixed material of an electron transport material and an insulative organo metal salt, and the organo metal salt may be a material having an energy band gap of at least about 4 eV. Specifically, the organo metal salt may include, for example, a metal acetate, a metal benzoate, a metal acetoacetate, a metal acetylacetonate, or a metal stearate.

The cathode CE may be disposed on the organic light emitting layer EML. In an embodiment, the cathode CE may be semi-transmissive or transmissive.

In embodiments in which the cathode CE is semi-transmissive, a composition material of the cathode CE may include silver (Ag), magnesium (Mg), copper (Cu), aluminum (Al), platinum (Pt), palladium (Pd), gold (Au), nickel (Ni), neodymium (Nd), iridium (Ir), chrome (Cr), lithium (Li), calcium (Ca), lithium fluoride (LiF)/Ca, LiF/Al, molybdenum (Mo), titanium (Ti), or compounds or mixtures thereof, e.g., a mixture of Ag and Mg. Moreover, when the thickness of the cathode CE is about tens to hundreds of angstroms, the cathode CE may be semi-transmissive.

In embodiments in which the cathode CE is transmissive, a composition material of the cathode CE may include a transparent conductive oxide (TCO). For example, the composition material of the cathode CE may include tungsten oxide ($WxOx$), titanium oxide ($TiO_2$), indium tin oxide (ITO), indium zinc oxide (IZO), zinc oxide (ZnO), indium tin zinc oxide (ITZO), or magnesium oxide (MgO).

The thin film encapsulation part TFE is disposed on the cathode CE and seals the organic light emitting diode OLED. Thus, gas or moisture that could potentially infiltrate through the organic light emitting diode OLED side is blocked by the thin film encapsulation part TFE.

The thin film encapsulation part TFE may include an inorganic film and an inorganic film disposed on the inorganic film. In an embodiment, the thin film encapsulation part may include, successively stacked in the thickness or third direction of the base substrate BS1, a first inorganic film CL1, a first organic film OL1, and a second inorganic film CL2. Embodiments are not limited to particular numbers of inorganic films and organic films in the thin film encapsulation part TFE. For example, in another embodiment, the thin film encapsulation part TFE may include two organic films that are alternately disposed with the two inorganic films.

As discussed above, the thin film encapsulation part TFE seals the organic light emitting diode OLED. Moreover, the thin film encapsulation part TFE may utilize the structure of the first and second inorganic films CL1 and CL2 to reflect colored light emitted from the quantum dot layer QL. Thus, the colored light reflected by the quantum dot layer QL may be externally emitted through a window assembly WA. Consequently, the intensity of the colored light used by the organic light emitting display device to display an image may be increased due to the thin film encapsulation part TFE. Taking into account the path of the colored light reflected by the above-discussed thin film encapsulation part TFE, the thin film encapsulation part TFE recycles the colored light.

The quantum dot layer QL and a light blocking layer BM are disposed on the thin film encapsulation part TFE. In an embodiment, the quantum dot layer QL includes first quantum dots (QD1 in FIG. 4B) and second quantum dots (QD2 in FIG. 4B).

In an embodiment, the quantum dot layer QL converts light provided from the organic light emitting diode OLED into light having a different wavelength from the light. For example, when blue light is output from the organic light emitting diode OLED, the first quantum dots QD1 in the quantum dot layer QL convert the blue light into red light, and the second quantum dots QD2 in the quantum dot layer QL convert the blue light into green light.

In an embodiment, the first and second inorganic films CL1 and CL2 reflect light having differing wavelengths. In more detail, the first inorganic film CL1 reflects red light and transmits light having a different wavelength from the red light. The second inorganic film CL2 reflects green light and transmits light having a different wavelength from the green light. More detailed descriptions of the structure and function of the first and second inorganic films CL1 and CL2 are provided below with reference to FIGS. 3A to 3D.

Figure 3A:
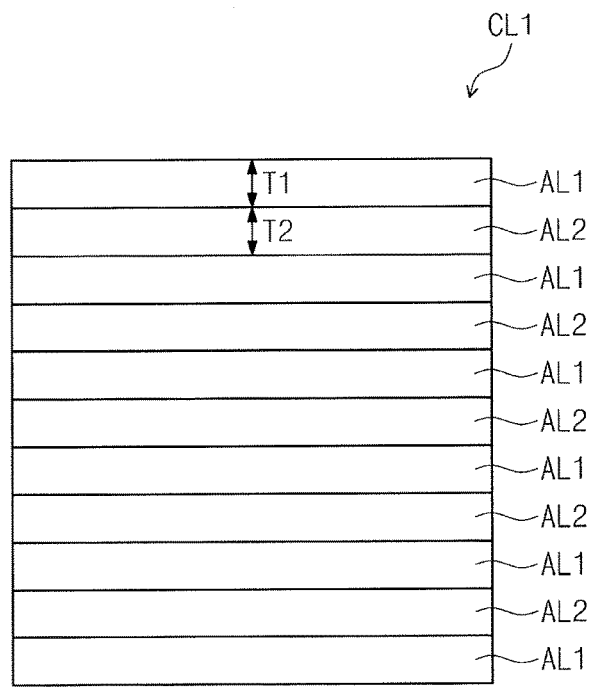
FIG. 3A illustrates an expanded cross-sectional view of a first inorganic film in a thin film encapsulation part in FIG. 2B.
Figure 3B:
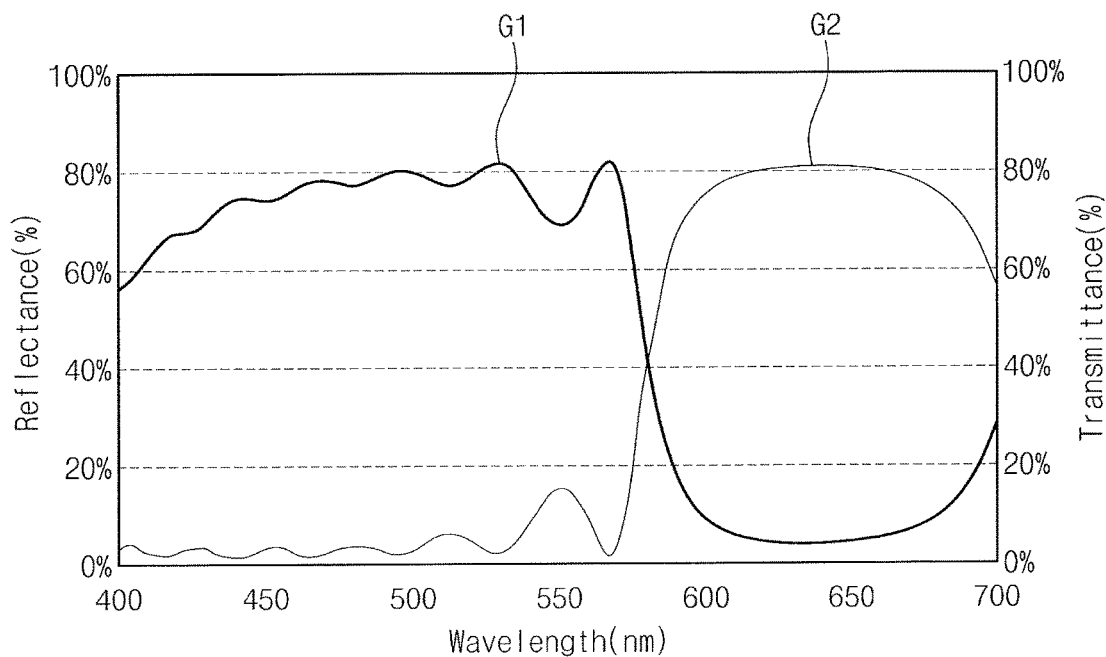
FIG. 3B illustrates the transmittance and reflectance according to wavelength for a first inorganic film.
Figure 3C:
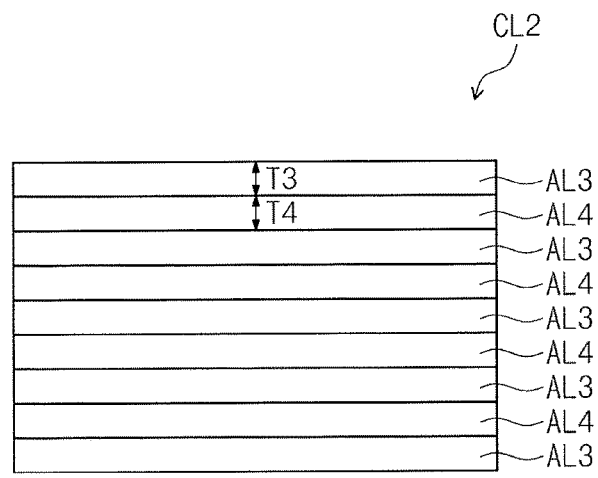
FIG. 3C illustrates an expanded cross-sectional view of a cross section of a second inorganic film in a thin film encapsulation part illustrated in FIG. 2B.
Figure 3D:
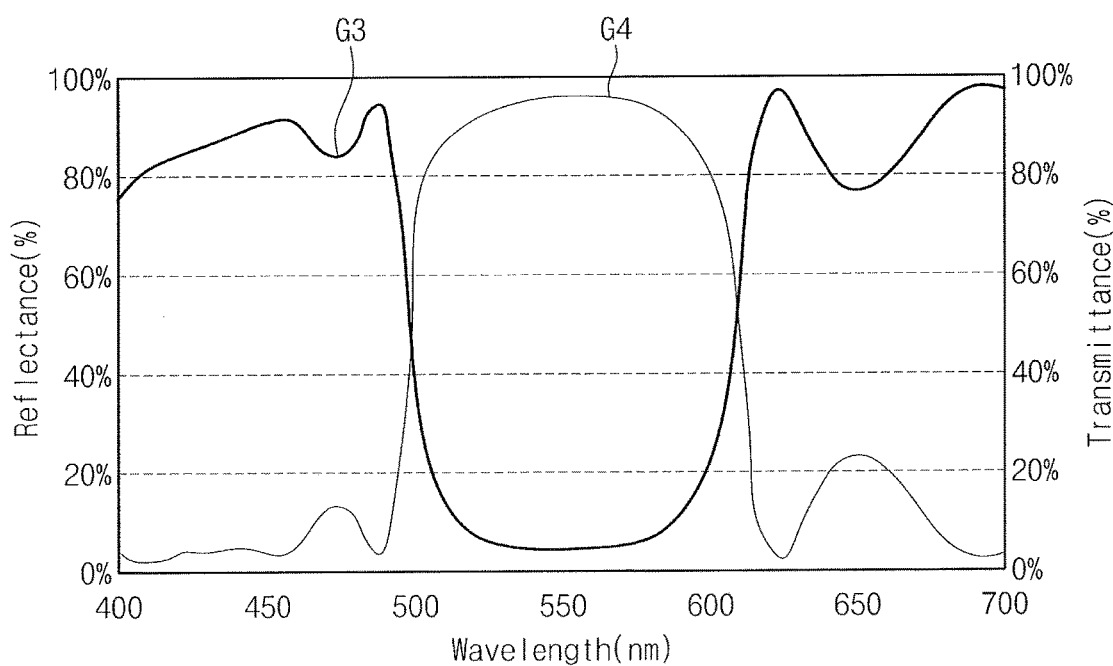
FIG. 3D illustrates the transmittance and reflectance according to wavelength for a second inorganic film.

FIG. 3A is an expanded cross-sectional view of a first inorganic film CL1 in a thin film encapsulation part illustrated in FIG. 2B and FIG. 3B illustrates the transmittance and reflectance according to wavelength for a first inorganic film. FIG. 3C is an expanded cross-sectional view of a second inorganic film CL2 in a thin film encapsulation part illustrated in FIG. 2B, and FIG. 3D illustrates the transmittance and reflectance according to wavelength for a second inorganic film.

Referring to FIGS. 2B, 3A, and 3B, a first inorganic film CL1 in a thin film encapsulation part TFE includes pluralities of first and second auxiliary films AL1 and AL2 which are alternately stacked in the thickness direction of a base substrate BS1.

In an embodiment, in the first inorganic film CL1, the number of the plurality of first auxiliary films AL1 may be about 3 to 10 and the number of the plurality of second auxiliary films AL2 may be about 3 to 10. However, embodiments are not limited to particular numbers of first auxiliary films AL1 and second auxiliary films AL2. In other embodiments, each of the number of the plurality of first auxiliary films AL1 and the number of the plurality of second auxiliary films AL2 may exceed 10.

In an embodiment, each first auxiliary film AL1 may have a first refractive index and each second auxiliary film AL2 may have a second refractive index, wherein the first refractive index is greater than the second refractive index. In an embodiment, the first auxiliary film AL1 may include a silicon nitride (SiNx), which has a refractive index of about 2.05, and the second auxiliary film AL2 may include a silicon oxide (SiOx), which has a refractive index of about 1.46. In another embodiment, the first auxiliary film AL1 may include SiNx, which has a refractive index of about 2.05, and the second auxiliary film AL2 may include a silicon carbon nitride (SiCN), which has a refractive index of about 1.83.

However, as long as the refractive indices of the first and second auxiliary films AL1 and AL2 are different, embodiments are not limited to particular materials for the first and second auxiliary films AL1 and AL2. For example, in another embodiment, the combination of materials used for the first and second auxiliary films AL2 and AL2 may be SiNx and a silicon oxynitride (SiON). In still another embodiment, the combination of materials used for the first and second auxiliary films AL1 and AL2 may be a combination of SiON and SiOx. Here, when taking into account that the refractive index of SiON increases as the content of nitrogen increases relative to oxygen in SiON and the refractive index of SiON decreases as the content of oxygen increases relative to nitrogen in SiON, the refractive index of SiON may be adjusted so as to be between the refractive indices of SiOx and SiNx.

When the first inorganic film CL1 has the structure described above, the intensity of reflected light in a particular wavelength range may be maximized in the first inorganic film CL1 due to the interference between reflected lights reflected at the interface between neighboring auxiliary films among the plurality of first auxiliary films AL1 and the plurality of second auxiliary films AL2. In an embodiment, the refractive indices and thicknesses of the first and second auxiliary films AL1 and AL2 may be adjusted to maximize the intensity of the reflected light having the particular wavelength range such that the formula below is satisfied.

$$(d1+d2) \approx \{(\lambda/4) \times (1/n1)\} + \{(\lambda/4) \times (1/n2)\} \quad \text{[Formula]}$$

In the formula, d1 is a first thickness T1 of the first auxiliary film AL1, d2 is a second thickness T2 of the second auxiliary film AL2, n1 is the first refractive index of the first auxiliary film AL1, n2 is the second refractive index of the second auxiliary film AL2, and λ is the central wavelength of the reflected light.

In an embodiment, in a range in which the conditions of the above formula are satisfied, the thicknesses and refractive indices of each of the first and second auxiliary films AL1 and AL2 may be adjusted. For example, when the first refractive index is about 1.5 and the second refractive index is about 2.0, and central wavelength of the reflected light is about 670 nm, the first and second thicknesses T1 and T2 may be adjusted such that the sum of the first thickness T1 and the second thickness T2 may be about 195 nm. For example, the first thickness T1 may be about 127 nm and the second thickness T2 may be about 68 nm.

Referring to FIG. 3B, a first graph G1 shows the transmittance of the first inorganic film CL1 according to wavelength, and a second graph G2 shows the reflectance of the first inorganic film CL1 according to wavelength. Referring to the first and second graphs G1 and G2, the transmittance of the first inorganic film CL1 is high with respect to light in approximately the blue and green wavelength ranges and low with respect to light in the red wavelength range of about 630 nm to 680 m. Conversely, the reflectance of the first inorganic film CL1 is low with respect to light in the blue and green wavelength ranges and high with respect to light in the red wavelength range. That is, when looking at both the first and second graphs G1 and G2, the first inorganic film CL1 has a greater tendency to transmit rather than reflect blue and green light, and a greater tendency to reflect rather than transmit red light.

Referring to FIGS. 2B, 3C, and 3D, the second inorganic film CL2 in the thin film encapsulation part TFE includes pluralities of third and fourth auxiliary films AL3 and AL4 which are alternately stacked in the thickness direction of the base substrate BS1 or the third direction.

In an embodiment, in the second inorganic film CL2, the number of the plurality of third auxiliary films AL3 may be about 3 to 10 and the number of the plurality of fourth auxiliary films AL4 may be about 3 to 10. However, embodiments are not limited to particular numbers of third auxiliary films AL3 and fourth auxiliary films AL4. In other embodiments, each of the number of the plurality of third auxiliary films AL3 and the number of the plurality of fourth auxiliary films AL4 may exceed 10.

In an embodiment, each third auxiliary film AL3 has a third refractive index and each fourth auxiliary film AL4 has a fourth refractive index, wherein the third refractive index is greater than the fourth refractive index. In an embodiment, above-described combinations of materials for the first and second auxiliary films (AL1 and AL2 in FIG. 3A) may be used as combinations of materials for the third and fourth auxiliary films AL3 and AL4.

When the second inorganic film CL2 has the structure described above, the intensity of reflected light in a particular wavelength range may be maximized in the second inorganic film CL2 due to the interference between reflected lights reflected at the interface between neighboring auxiliary films among the plurality of third auxiliary films AL3 and the plurality of fourth auxiliary films AL4. In an embodiment, when the third auxiliary film AL3 has a third thickness T3 and the fourth auxiliary film AL4 has a fourth thickness T4, the values of the third refractive index, the fourth refractive index, the third thickness T3 and the fourth thickness T4 may be adjusted to maximize the intensity of the reflected light having the particular wavelength range such that the formula described above is satisfied.

In an embodiment, in a range in which the conditions of the above formula are satisfied, the thicknesses and refractive indices of each of the third and fourth auxiliary films AL3 and AL4 may be adjusted. For example, in the case in which the third refractive index is about 1.5 and the fourth refractive index is about 2.0, and a central wavelength of the reflected light is about 570 nm, the third and fourth thicknesses T3 and T4 may be adjusted such that the sum of the third thickness T3 and the fourth thickness T4 may be about 166 nm. For example, the third thickness T3 may be about 113 nm and the fourth thickness T4 may be about 53 nm.

Referring to FIG. 3D, the transmittance of the second inorganic film CL2 according to wavelength is shown in a third graph G3 and the reflectance of the second inorganic film CL2 according to wavelength is shown in a fourth graph G4. Referring to the third and fourth graphs G3 and G4, the reflectance of the second inorganic film CL2 is high with respect to light in approximately the blue and red wavelength ranges, and low with respect to the green wavelength range of about 520 to 580 nm. Conversely, the reflectance of the second inorganic film CL2 is low with respect to light in the blue and red wavelength ranges, and high with respect to light in the green wavelength range. That is, when looking at both the third and fourth graphs G3 and G4, the second inorganic film CL2 has a greater tendency to transmit rather than reflect blue and red light, and a greater tendency to reflect rather transmit green light.

Referring again to FIG. 3C, when the particular wavelength of each of the reflected lights reflected at the second inorganic film CL2 is defined and the sum of the third and fourth thicknesses T3 and T4 is defined, the value of the particular wavelength may increase as the difference between the third and fourth refractive indices increases.

Moreover, when the particular wavelength of each of the reflected lights reflected at the second inorganic film CL2 is defined and the values of the third and fourth refractive indices are defined, the value of the particular wavelength may be proportional to the sum of the third and fourth thicknesses T3 and T4. Thus, with reference to FIGS. 3A and 3C, since the first and third auxiliary films AL1 and AL3 have the same refractive index, the second and fourth auxiliary films AL2 and AL4 have the same refractive index, and the wavelength of red light reflected at the first inorganic film CL1 is longer than the wavelength of green light reflected at the second inorganic film CL2, the sum of the first and second thicknesses T1 and T2 may be greater than the sum of the third and fourth thicknesses T3 and T4. That is, in preparing the first and second inorganic films CL1 and CL2, values of the particular wavelength of the reflected light reflected at each of the first and second inorganic films CL1 and CL2 may be adjusted by adjusting the first to fourth thicknesses T1 to T4 of the first to fourth auxiliary films AL1 to AL4, rather than by adjusting the refractive indices of the materials in the first to fourth auxiliary films AL1 to AL4.

In an embodiment, the first and second inorganic films CL1 and CL2 may be formed using a chemical vapor deposition method. Moreover, each of the first and second inorganic films CL1 and CL2 may be formed at the same time by controlling the types of source gasses introduced into a single chamber. For example, when the first auxiliary films AL1 are formed of SiNx and the second auxiliary films AL2 are formed of SiOx, the first inorganic film CL1 may be formed by adjusting the mixing ratio of the source gasses, e.g., silane ($SiH_4$), ammonia ($NH_3$), nitrogen ($N_2$), and hydrogen ($H_2$), introduced into the chamber such that the first auxiliary films AL1 and the second auxiliary films AL2 are alternately stacked. In addition, when the third auxiliary film AL3 is formed of SiCN and the fourth auxiliary films AL4 are formed of SiNx, the second inorganic film CL2 may be formed by adjusting the mixing ratio of the source gasses, e.g., $SiH_4$, $NH_3$, $N_2$, and $H_2$, introduced into the chamber such that the third auxiliary films AL3 and the fourth auxiliary films AL4 are alternately stacked.

Figure 4A:
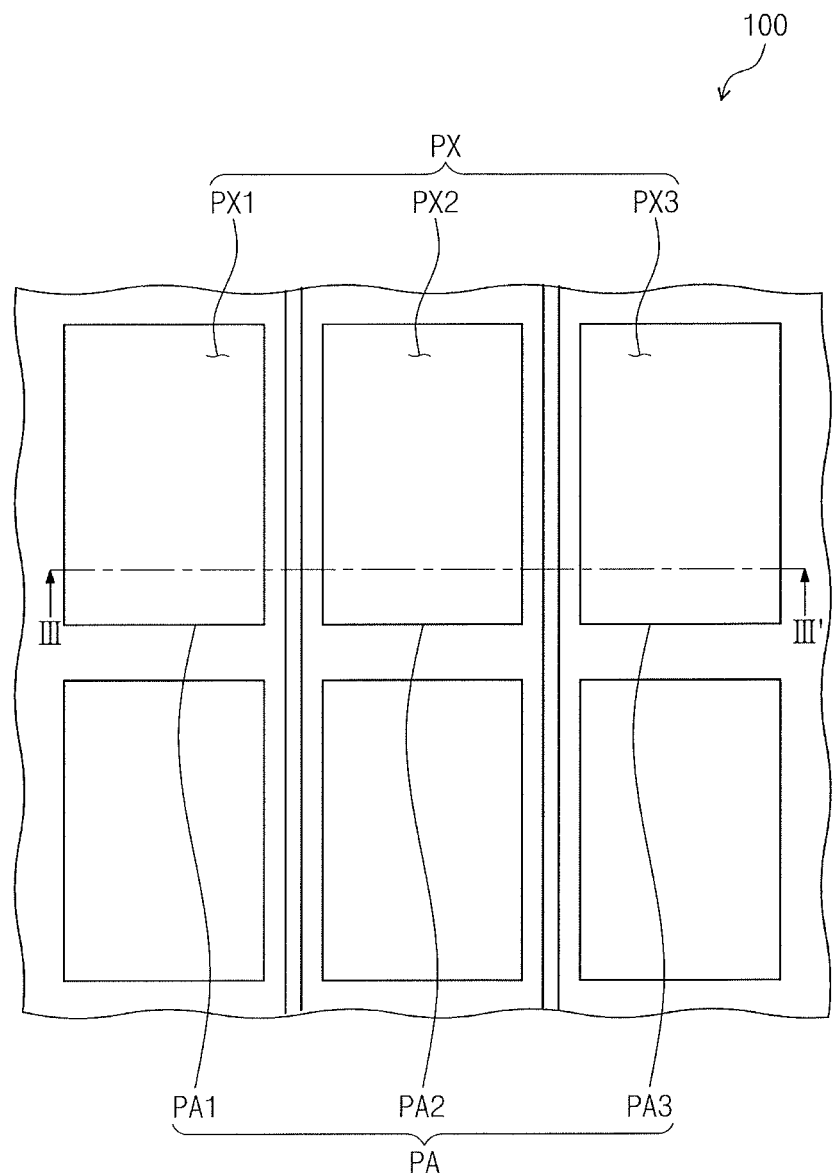
FIG. 4A illustrates an expanded plan view of a first pixel, a second pixel, and a third pixel in FIG. 1A.
Figure 4B:
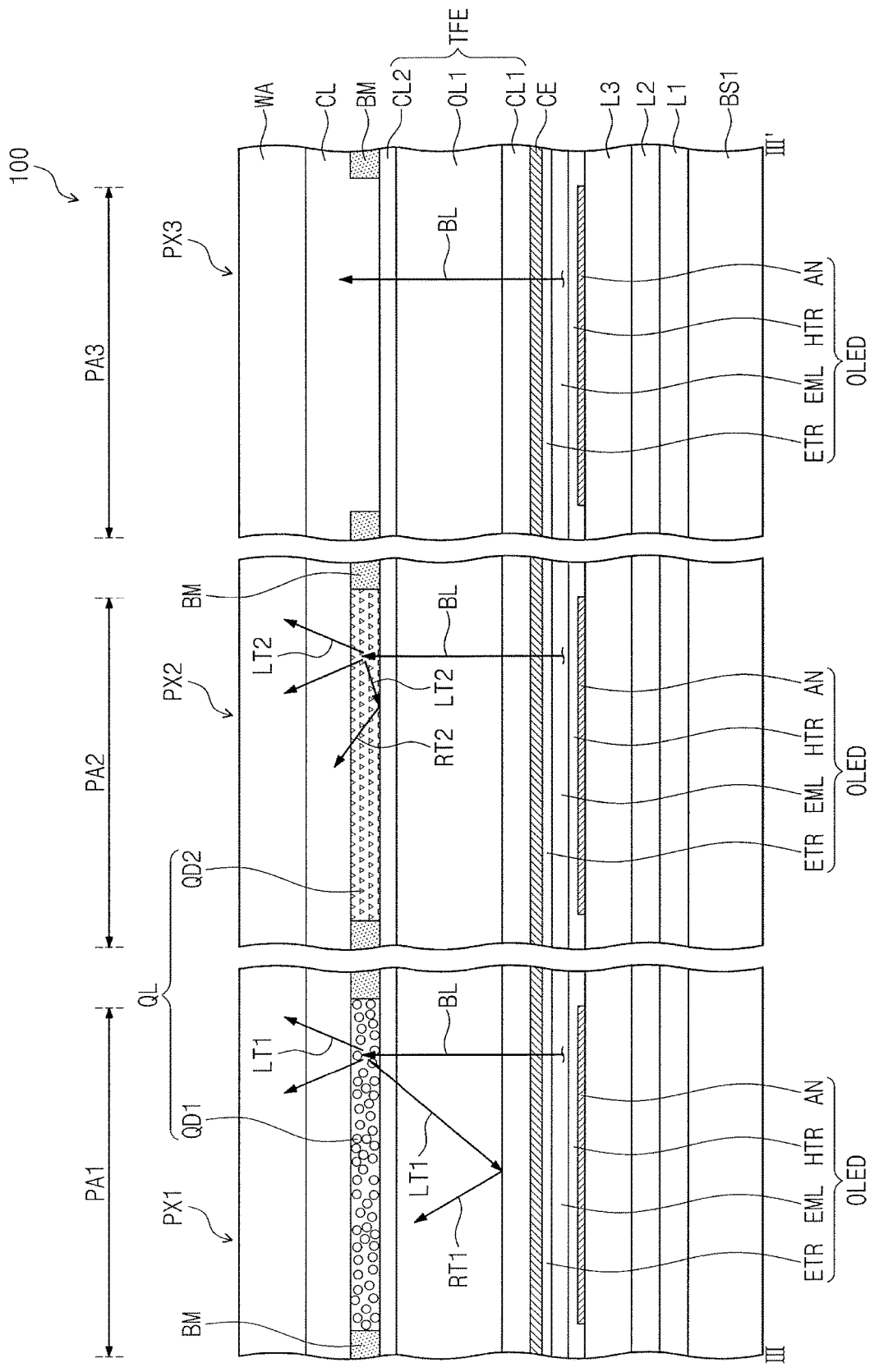
FIG. 4B illustrates a cross-sectional view along III-III' in FIG. 4A.

FIG. 4A is an expanded plan view of the first pixel PX1, the second pixel PX2, and the third pixel PX3 illustrated in FIG. 1A. FIG. 4B is a cross-sectional view along III-III' in FIG. 4A. In describing FIGS. 4A and 4B, elements which are described above are indicated using the same reference numerals as above, and descriptions of such elements given above are not repeated.

Referring to FIGS. 4A and 4B, the first pixel PX1 described with reference to FIGS. 2A and 2B is disposed in the first pixel area PA1, the second pixel PX2 is disposed in the second pixel area PA2, and the third pixel PX3 is disposed in the third pixel area PA3. In an embodiment, each of the first to third pixels PX1, PX2, and PX3 may include the above-described organic light emitting diode OLED which emits a base light BL of blue light. Moreover, the quantum dot layer QL includes the first quantum dots QD1 corresponding to the first pixel area PA1, the second quantum dots QD2 corresponding to the second pixel area PA2, and in which no quantum dot layer QL is provided in the third pixel area PA3.

Hereinafter, the organic light emitting display device 100 using the configuration of the organic light emitting diode OLED and the quantum dot layer QL to output different colored lights through the first to third pixel areas PA1, PA2, and PA3, and the function of recycling the colored lights using the thin film encapsulation part TFE are described.

The base light BL is output from the organic light emitting diode OLED, and may be a blue light. In an embodiment, since the organic light emitting layer EML in the organic light emitting diode OLED is a continuous film across the first to third pixel areas PA1, PA2, and PA3, the base light BL may be commonly output from the organic light emitting layer EML across the first to third pixel areas PA1, PA2, and PA3.

The base light BL output from the organic light emitting layer EML passes through the thin film encapsulation part TFE to be provided to the quantum dot layer QL in the first and second pixel areas PA1 and PA2. As described above with reference to FIGS. 3A and 3B, since the first and second inorganic films CL1 and CL2 allow blue light to pass through, when the base light BL is provided to the quantum dot layer QL, the base light BL may pass through the first and second inorganic films CL1 and CL2.

When the base light BL is provided to the first quantum dots QD1 in the quantum dot layer QL, the base light BL is converted by the first quantum dots QD1 into a first light LT1 having a different wavelength than the base light BL. In an embodiment, the first light LT1 may be a red light. Since each of the first quantum dots QD1 may have the shape of a dot, the first light LT1 may be emitted substantially isotropically from the first quantum dots QD1. Thus, a first portion of the first light LT1 is output to the outside through the window assembly WA, while a second portion of the first light LT1 travels toward the thin film encapsulation part TFE.

Since, as described above with reference to FIGS. 3A and 3B, the first inorganic film CL1 in the encapsulation film TFE reflects red light, the first light LT1 is reflected at the first inorganic film CL1, thereby generating a first reflected light RT1, such that the first reflected light RT1 may be output to the outside through the window assembly WM. That is, the first light LT1 may be regenerated by the first inorganic film CL1 in the thin film encapsulation part TFE.

When the base light BL is provided to the second quantum dots QD2 in the quantum dot layer QL, the base light BL is converted by the second quantum dots QD2 into a second light LT2 having a wavelength that differs from the wavelengths of the base light BL and the first light LT1. In an embodiment, the second light LT2 may be a green light.

In addition, since the second light LT2 is emitted substantially isotropically from the second quantum dots QD2, a portion of the second light LT2 is output to the outside through the window assembly WA, and another portion of the second light LT2 travels toward the thin film encapsulation part TFE. In this case, since, as described above with reference to FIGS. 3C and 3D, the second thin film CL2 in the thin film encapsulation part TFE reflects green light, the second light LT2 is reflected at the second inorganic film CL2, thereby generating a second reflected light RT2, such that the second reflected light RT2 may be output to the outside through the window assembly WA. That is, the second light LT2 may be regenerated by the second inorganic film CL2 in the thin film encapsulation part TFE.

Referring to the above-described function of the thin film encapsulation part TFE of regenerating the first and second lights LT1 and LT2, since the intensity of the first and second lights LT1 and LT2 output to the outside through the window assembly WA is increased, the display quality of the organic light emitting display device 100 may be improved.

Figure 5A:
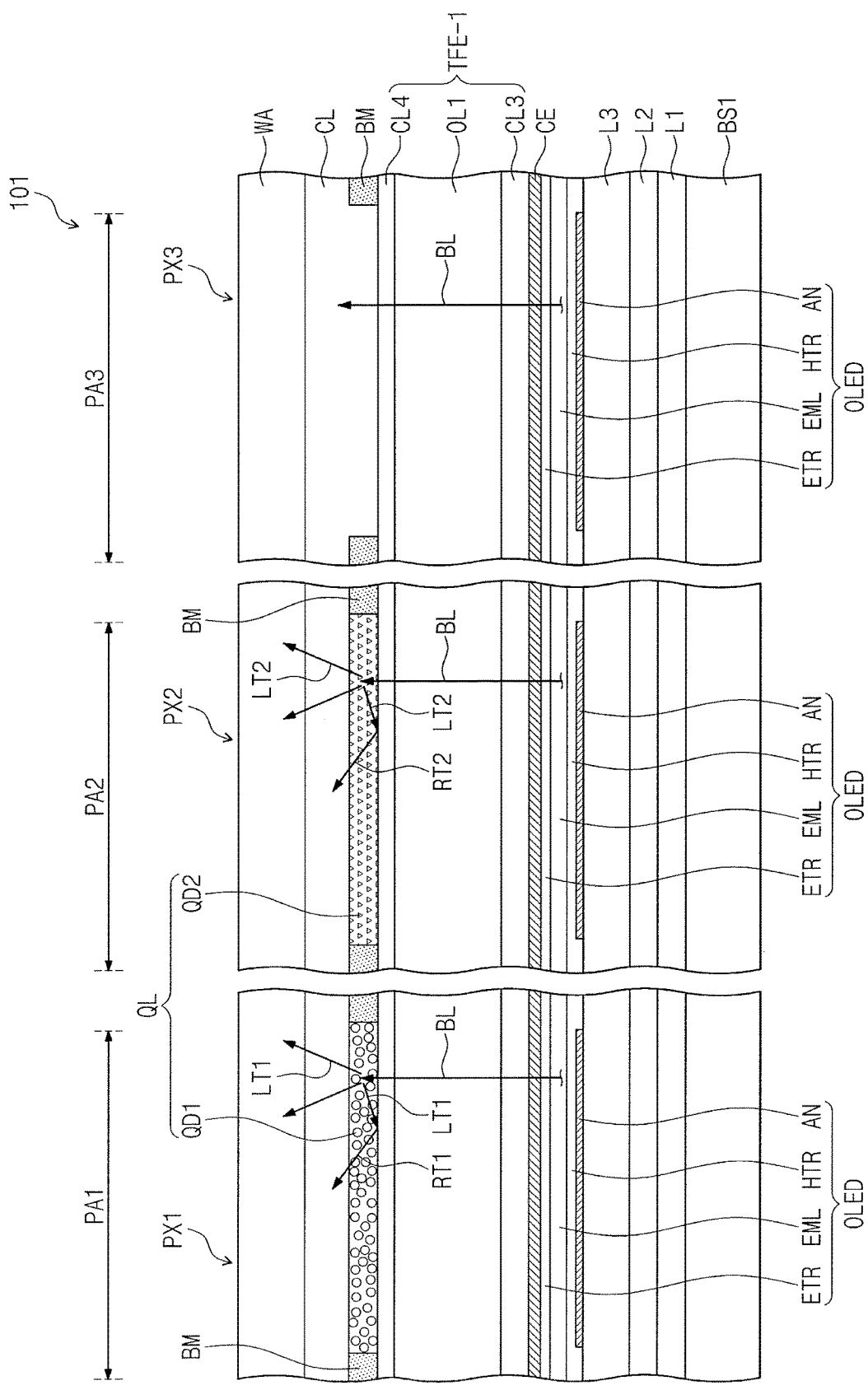
FIG. 5A illustrates a cross-sectional view of an organic light emitting display device according to another embodiment.
Figure 5B:
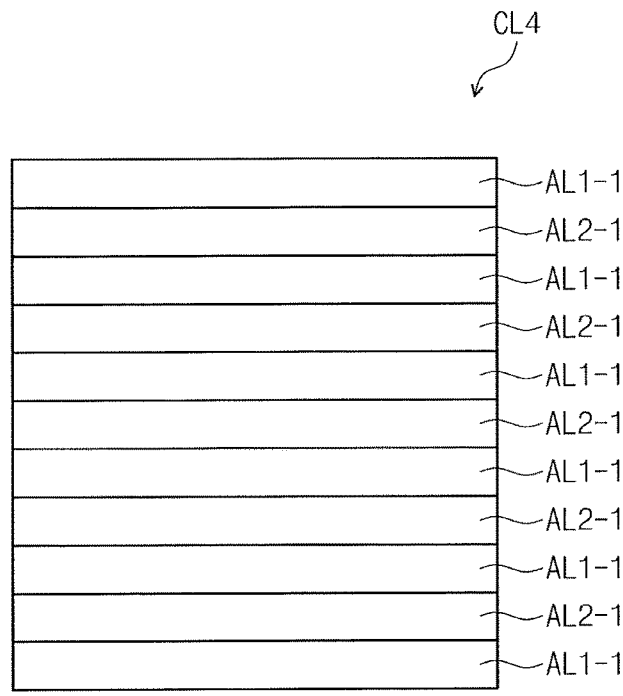
FIG. 5B illustrates an expanded cross-sectional view of a fourth inorganic film in a thin film encapsulation part in FIG. 5A.
Figure 5C:
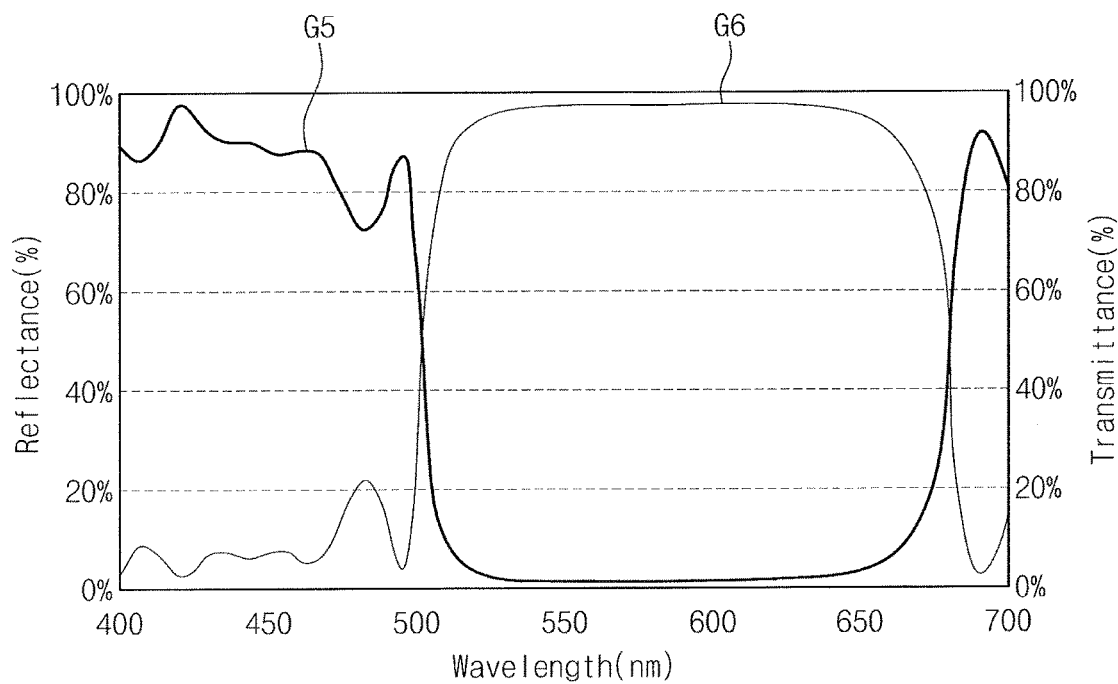
FIG. 5C illustrates the transmittance and reflectance according to wavelength for a fourth inorganic film.

FIG. 5A is a cross-sectional view of an organic light emitting display device 101 according to another embodiment, FIG. 5B is an expanded cross-sectional view of a fourth inorganic film CL4 in a thin film encapsulation part TFE-1 illustrated in FIG. 5A, and FIG. 5C illustrates the transmittance and reflectance according to wavelength for the fourth inorganic film CL4. In describing FIGS. 5A to 5B, identical reference numerals will be used for those elements which have already been described above, and descriptions for such elements will not be repeated.

First, referring to FIGS. 5A and 5B, a base light BL is output from an organic light emitting diode OLED in an organic light emitting display device 101, and the base light BL passes through the thin film encapsulation part TFE-1 to be provided to the quantum dot layer QL. In an embodiment, the base light BL may be a blue light. In an embodiment, the thin film encapsulation part TFE-1 may include a first inorganic film CL3, the first organic film OL1, and a second inorganic film CL4.

In an embodiment, the first inorganic film CL3 may be formed of a single material and allow light over the entire wavelength range of visible light to pass through. Conversely, the second inorganic film CL4 may have a structure in which a plurality of first auxiliary films AL1-1 and a plurality of second auxiliary films AL2-1 are alternately arranged with each other.

In an embodiment, when each first auxiliary film AL1-1 of the plurality of first auxiliary films AL1-1 has a first refractive index and each second auxiliary film AL2-1 of the plurality of second auxiliary films AL2-1 has a second refractive index, the first refractive index is greater than the second refractive index. In an embodiment, the first auxiliary film AL-1 may include $TiO_2$, which has a refractive index of about 2.26, and the second auxiliary film AL-2 may include $SiO_2$, which has a refractive index of about 1.46.

As with the first inorganic film (CL1 in FIG. 3A) or the second inorganic film (CL2 in FIG. 3C), when the second inorganic film CL4 has the structure described above, reflected light having a particular wavelength may be reflected at the second inorganic film CL4 due to interference between reflected lights reflected at the interface between neighboring auxiliary films among the plurality of first auxiliary films AL-1 and the plurality of second auxiliary films AL2.

Moreover, as described above with reference to FIGS. 3A and 3B, the value of the particular wavelength of the reflected light reflected at the second inorganic film CL4 may be adjusted using the refractive indices and thicknesses of the first and second auxiliary films AL1-1 and AL2-1.

In the embodiment disclosed in FIGS. 5A and 5B, the difference between the refractive indices of $TiO_2/SiO_2$, which are the materials in the first and second auxiliary films AL1-1 and AL2-1, is about 0.8, and the difference between the refractive indices of SiNx/SiOx or SiNx/SiCN, which are the materials in the first and second auxiliary films (AL1 and AL2 in FIG. 3A) in the embodiment illustrated above in FIG. 3A is about 0.3 to 0.6. As described above, when the difference in the refractive indices increases, the value of the particular wavelength of the reflected light reflected at the second inorganic film CL4 may be greater than the value of the particular wavelength of the reflected light reflected at the first inorganic film (CL1 in FIG. 3A). This is described below with reference to FIG. 5C.

Referring to FIG. 5C, a fifth graph G5 shows the transmittance of the second inorganic film CL4 according to wavelength, and a sixth graph G6 shows the reflectance of the second inorganic film CL4 according to wavelength. Referring to the fifth and sixth graphs G5 and G6, the transmittance of the second inorganic film CL4 is high with respect to light in approximately the blue wavelength range and low with respect to light in the red and green wavelength range of about 530 nm to 680 nm. Conversely, the reflectance of the second inorganic film CL4 is low with respect to light in the blue wavelength range and high with respect to light in the red and green wavelength ranges. That is, when considering both the fifth and sixth graphs G5 and G6, the second inorganic film CL4 has a greater tendency to transmit rather than reflect blue light, and a greater tendency to reflect rather than transmit red and green light.

Referring again to FIG. 5A, since, as described above, the first and second inorganic films CL3 and CL4 allow blue light to pass through, when the base light BL output from the organic light emitting diode OLED passes through the thin film encapsulation part TFE-1 and is thereby provided to the quantum dot layer QL, the base light BL may pass through the first and second inorganic films CL3 and CL4.

Moreover, when the base light BL is provided to the first quantum dots QD1 in the quantum dot layer QL, the base light BL is converted by the first quantum dots QD1 into a first light LT1 having a different wavelength than the base light BL. Furthermore, when the base light BL is provided to the second quantum dots QD2 in the quantum dot layer QL, the base light BL is converted into by the second quantum dots QD2 into a second light LT2 having a wavelength which differs from the wavelength of the base light BL and the wavelength of the first light LT1. In an embodiment, the first light LT1 may be red light and the second light LT2 may be green light.

In addition, since the first and second lights LT1 and LT2 are emitted substantially isotropically from the first and second quantum dots QD1 and QD2, a first portion of the first and second lights LT1 and LT2 is output to the outside through a window assembly WA, and a second portion of the first and second lights LT1 and LT2 travels toward the thin film encapsulation part TFE-1. In this case, as described above, since the second inorganic film CL4 in the thin film encapsulation part TFE-1 reflects red light and green light, the first and second lights LT1 and LT2 are reflected at the second inorganic film CL4, thereby generating first and second reflected lights RT1 and RT2, and the first and second reflected lights RT1 and RT2 may be output to the outside thought the window assembly WA. That is, the first and second lights LT1 and LT2 may be regenerated by the second inorganic film CL4 in the thin film encapsulation part TFE-1.

Figure 6:
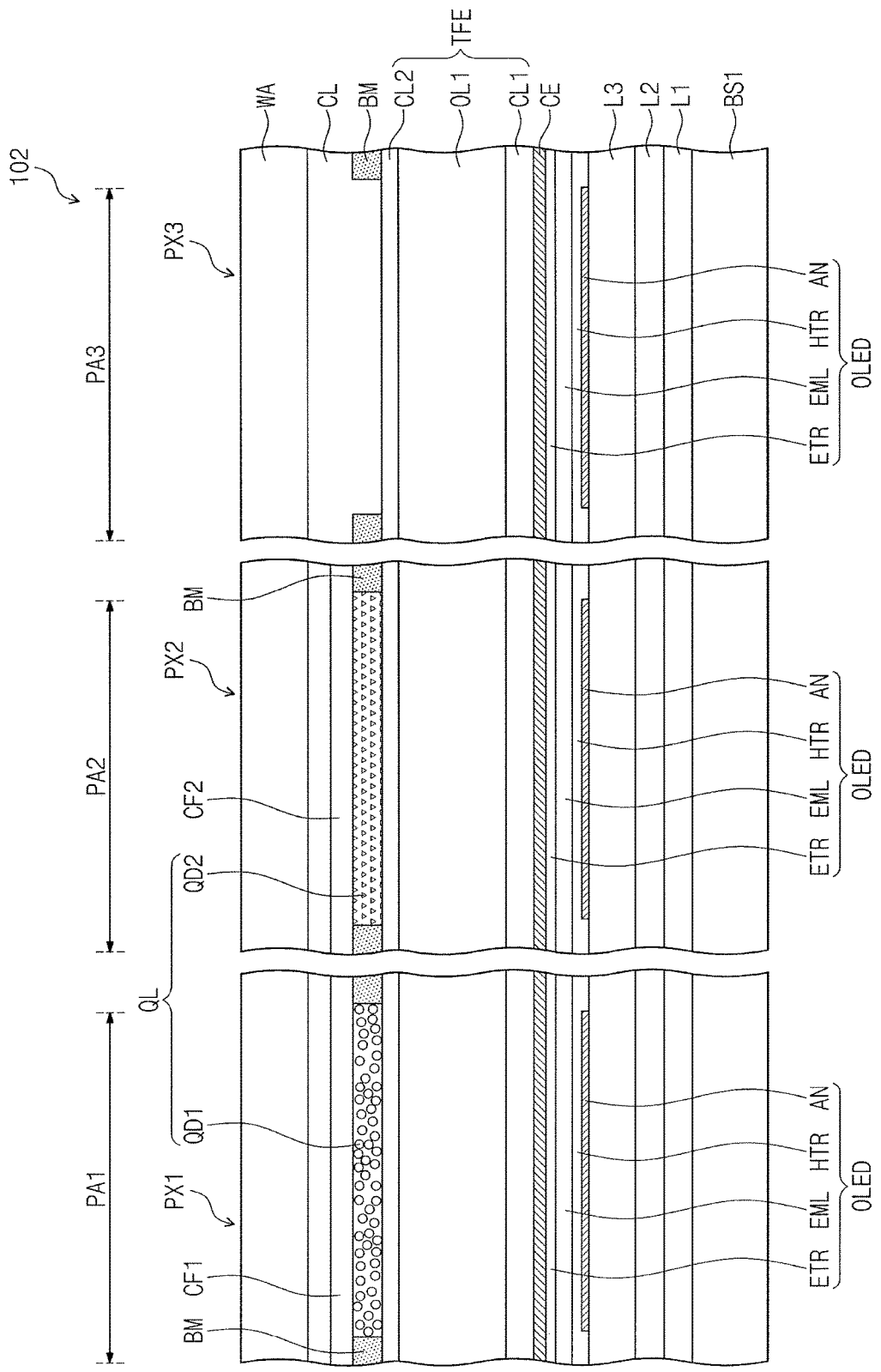
FIG. 6 illustrates a cross-sectional view of an organic light emitting display device according to another embodiment.

FIG. 6 is a cross-sectional view of an organic light emitting display device 102 according to another embodiment. In describing FIG. 6, elements which are described above are indicated using the same reference numerals as above, and descriptions of such elements are not repeated.

Referring to FIG. 6, compared to the organic light emitting display device (100 in FIG. 4B) illustrated in FIG. 4B, the organic light emitting display device 102 illustrated in FIG. 6 further includes a first color filter CF1 and a second color filter CF2.

The first color filter CF1 is disposed in the first pixel area PA1 above the pixel layer PL with the quantum dot layer QL having the first quantum dots QD1 therebetween. The second color filter CF2 is disposed in a second pixel area PA2 above the pixel layer PL with the quantum dot layer QL having the second quantum dots QD2 therebetween. No color filter may be provided in the third pixel area PA3.

In an embodiment, the first color filter CF1 blocks green light and blue light, and transmit red light. Thus, the purity of the red light output from the first pixel area PA1 may be enhanced by the first color filter CF1. Moreover, since external light traveling toward the quantum dot layer QL through a window assembly WA is blocked by the first color filter CF1, the quantum dot layer QL being illuminated by the external light may be prevented.

In an embodiment, the second color filter CF2 blocks red light and blue light, and transmits green light. Thus, the purity of the green light output from the second pixel area PA2 may be enhanced by the second color filter CF2. Moreover, since the external light is blocked by the second color filter CF2, the quantum dot layer QL being illuminated by the external light may be prevented.

Figure 7:
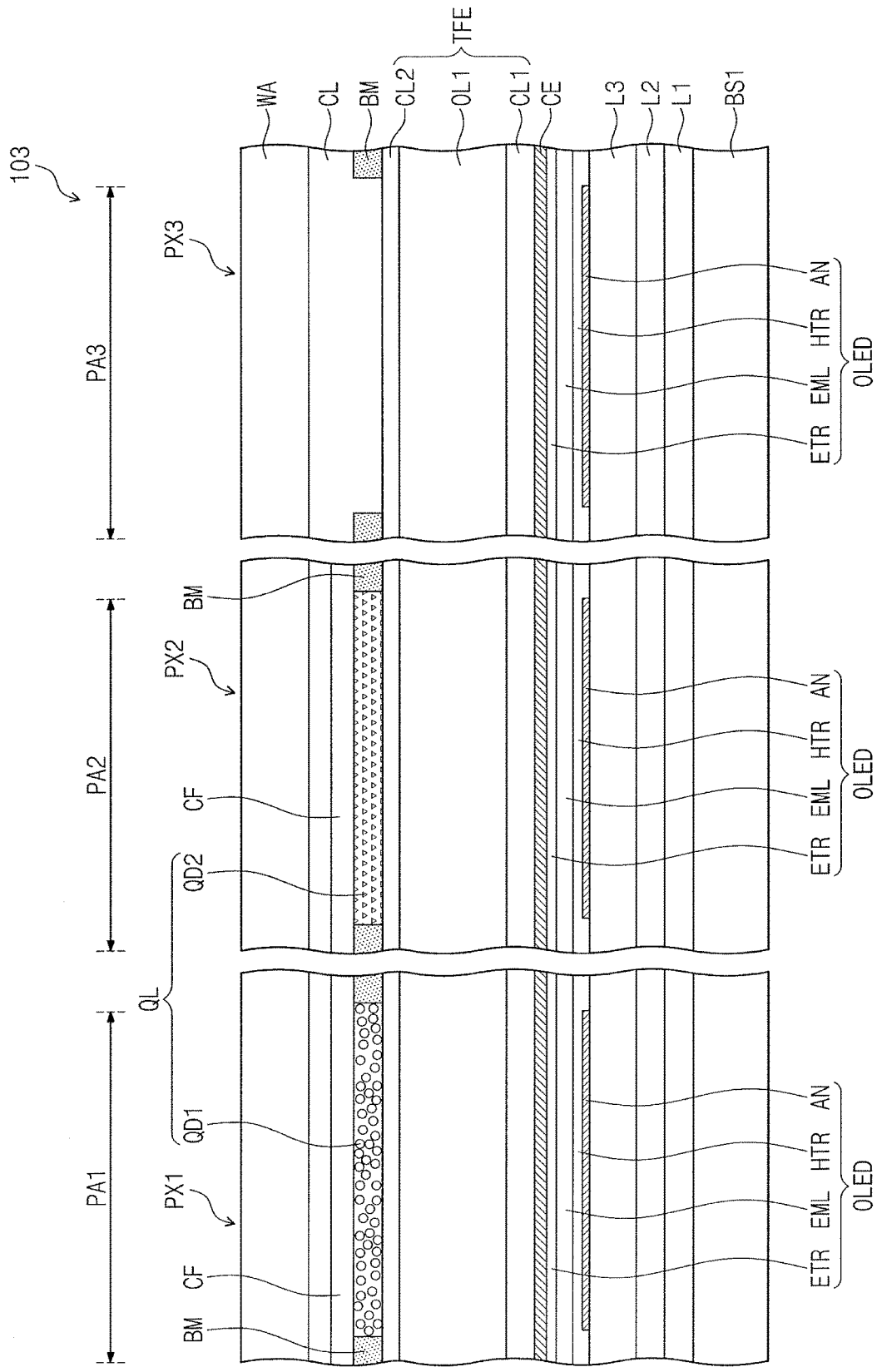
FIG. 7 illustrates a cross-sectional view of an organic light emitting display device according to another embodiment.

FIG. 7 is a cross-sectional view of an organic light emitting display device 103 according to another embodiment. In describing FIG. 7, elements which are described above are indicated using the same reference numerals as above, and descriptions of such elements are not repeated.

Referring to FIG. 7, the organic light emitting display device 103 further includes a color filter CF commonly disposed in a first pixel area PA1 and a second pixel area PA2, but not in the third pixel area PA3. The color filter CF is disposed above the pixel layer PL with the quantum dot layer QL therebetween.

In an embodiment, the color filter CF blocks blue light, and transmits red light and green light. Thus, the purity of the red light output from the first pixel area PA1 being degraded by the blue light may be prevented by the color filter CF and the purity of the green light emitted from the second pixel area PA2 being degraded by the blue light may be prevented by the color filter CF. Moreover, since the color filter CF blocks external light, e.g., ultraviolet radiation, the emission of light by the quantum dot layer QL may be prevented by the color filter CF.

Figure 8A:
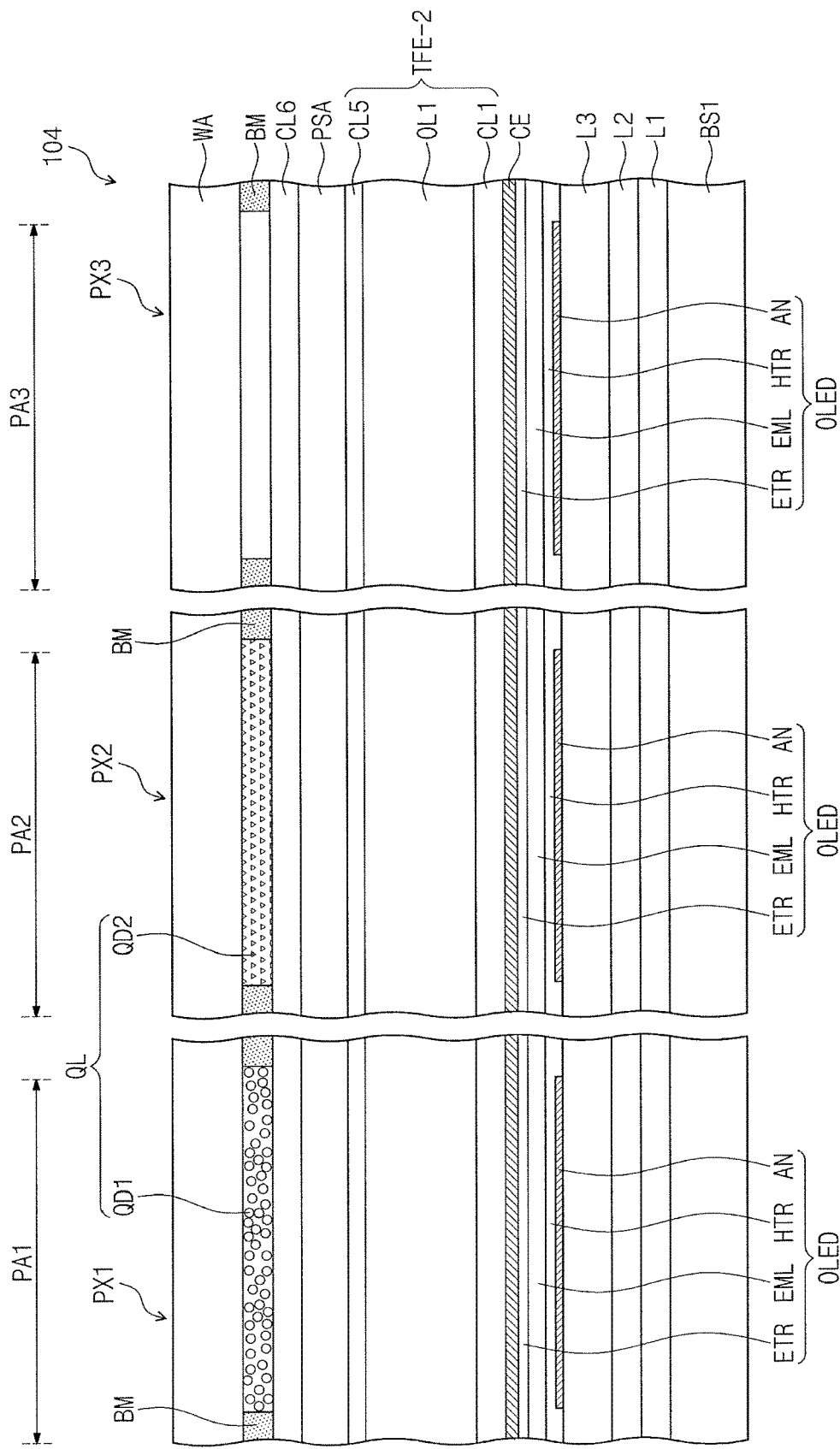
FIG. 8A illustrates a cross-sectional view of an organic light emitting display device according to another embodiment.
Figure 8B:
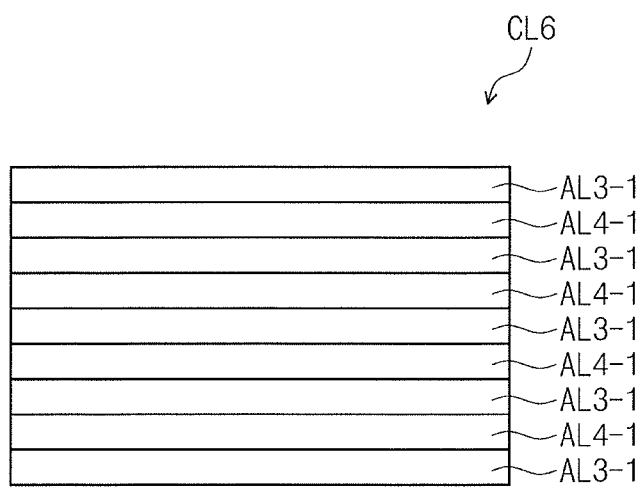
FIG. 8B illustrates an expanded cross-sectional view of a third inorganic film in FIG. 8A.

FIG. 8A is a cross-sectional view of an organic light emitting display device 104 according to another embodiment, and FIG. 8B is an expanded cross-sectional view of a third inorganic film CL6 illustrated in FIG. 8A. In describing FIGS. 8A and 8B, elements which are described above are indicated using the same reference numerals as above, and descriptions of such elements are not repeated.

Referring to FIGS. 8A and 8B, the organic light emitting display device 104 includes a thin film encapsulation part TFE-2, and the thin film encapsulation part TFE-2 includes the first inorganic film CL1 and a second inorganic film CL5. The first inorganic film CL1 may include a plurality of first auxiliary films (AL1 in FIG. 4B) and a plurality of second auxiliary films (AL2 in FIG. 4B) and reflects red light. Conversely, the second inorganic film CL5 may be a single material that transmits light in the visible light range.

In an embodiment, a third inorganic film CL6, the quantum dot layer QL, and an adhesive film PSA are provided to the window assembly WA, and the quantum dot layer QL, the third inorganic film CL6, and the adhesive film PSA are sequentially laminated in the thickness or third direction of the window assembly WA on the window assembly WA. Moreover, the window assembly WA may be adhered to the thin film encapsulation part TFE-2 by the adhesive layer PSA.

In an embodiment, the position of the third inorganic film CL6 in the organic light emitting display device 104 differs from the position of the second inorganic film (CL2 in FIG. 3C) illustrated in FIG. 3C, but the structure of the third inorganic film CL6 may be substantially identical to the structure of the second inorganic film. In greater detail, the third inorganic film CL6 may include a plurality of third auxiliary films AL3-1 and a plurality of fourth auxiliary films AL4-1 which are alternately laminated, the structure of the plurality of third auxiliary films AL3-1 may be identical to the structure of the plurality of third auxiliary films (AL3 in FIG. 3C), and the structure of the plurality of fourth auxiliary films AL401 may be the identical to the structure of the plurality of fourth auxiliary film (AL4 in FIG. 3C).

Thus, like the second inorganic film (CL2 in FIG. 3C) illustrated in FIG. 3C, the third inorganic film CL6 may have a greater tendency transmit rather than reflect blue light and red light, and a greater tendency to reflect rather than transmit green light. According to the structure of the above described first inorganic film CL1 and the third inorganic film CL6, red light output from the quantum dot layer QL may be reflected by the first inorganic film CL1 in the thin film encapsulation part TFE-2 such that the red light is regenerated, and green light output from the quantum dot layer QL may be reflected by the third inorganic film CL3 in the window assembly WA such that the green light is regenerated.

According to an embodiment, a mirror layer which selectively reflects light of a particular wavelength may be realized by alternately laminating auxiliary films having different refractive indices from each other in at least an inorganic film in a thin film encapsulation part of an organic light emitting display device. Thus, since the light intensity of a colored light used by the light emitting display device to display an image may be increased by using the structure of the thin film encapsulation part to reflect the light emitted from a quantum dot layer, the display quality of the organic light emitting display device may be enhanced.

In addition, since the mirror layer having a regeneration function of the colored light is realized in an inorganic film in the thin film encapsulation part, a separate mirror layer in the organic light emitting display device is not needed. Thus, a structure of the organic light emitting display device and a manufacturing method for the organic light emitting display device may be simplified.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An organic light emitting display device comprising:
a base substrate;
a pixel layer including a plurality of organic light emitting diodes and disposed on the base substrate;
a quantum dot layer including quantum dots on the pixel layer; and
a thin film encapsulation part between the quantum dot layer and the pixel layer, and sealing the pixel layer, wherein the thin film encapsulation part includes a first inorganic film and an organic film, the first inorganic film having
a plurality of first auxiliary films, each having a first refractive index, and
a plurality of second auxiliary films, each having a second refractive index different from the first refrac- tive index, alternately stacked with the plurality of first auxiliary films along a thickness direction of the base substrate.

2. The organic light emitting display device as claimed in claim 1, wherein:
each of the plurality of organic light emitting diodes includes an organic light emitting layer which emits a base light,
the first inorganic film transmits the base light to transmit and reflects a first light emitted from the quantum dot layer, and
the first light has a first wavelength different from a wavelength of the base light.

3. The organic light emitting display device as claimed in claim 2, wherein:
the plurality of first auxiliary films includes $TiO_2$; and
the plurality of second auxiliary films includes $SiO_2$.

4. The organic light emitting display device as claimed in claim 2, wherein the thin film encapsulation part further includes a second inorganic film on the first inorganic film with the organic film therebetween, the second inorganic film including:
a plurality of third auxiliary films, each having a third refractive index; and
a plurality of fourth auxiliary films, each having a fourth refractive index different from the third refractive index, alternately stacked with the plurality of third auxiliary films.

5. The organic light emitting display device as claimed in claim 4, wherein:
the plurality of the first auxiliary films and the plurality of the second auxiliary films are stacked in the thickness direction of the base substrate; and
the plurality of the third auxiliary films and the plurality of the fourth auxiliary films are stacked in the thickness direction of the base substrate.

6. The organic light emitting display device as claimed in claim 4, wherein:
a first pixel area, a second pixel area, and a third pixel area are defined in the base substrate; and
the quantum dot layer includes first quantum dots in the first pixel area that convert the base light into the first light and second quantum dots in the second pixel area that convert the base light into a second light having a second wavelength different from the wavelength of the base light and the first light.

7. The organic light emitting display device as claimed in claim 6, wherein the second inorganic film transmits the base light and reflects the second light.

8. The organic light emitting display device as claimed in claim 6, wherein the first and the second quantum dots are excluded from the third pixel area.

9. The organic light emitting display device as claimed in claim 6, wherein the first wavelength is longer than the second wavelength and the second wavelength is longer than the wavelength of the base light.

10. The organic light emitting display device as claimed in claim 6, wherein the base light has blue color, the first light has red color, and the second light has green color.

11. The organic light emitting display device as claimed in claim 4, wherein:
the plurality of the first auxiliary films and the plurality of the third auxiliary films include a same first composition material; and
the plurality of the second auxiliary films and the plurality of the fourth auxiliary films include a same second composition material.

12. The organic light emitting display device as claimed in claim 4, wherein a sum of the thickness of one of the plurality of the first auxiliary films and the thickness of one of the plurality of the second auxiliary films is greater than a sum of the thickness of one of the plurality of the third auxiliary films and the thickness of one of the plurality of the fourth auxiliary films.

13. The organic light emitting display device as claimed in claim 4, wherein:
the first and third auxiliary films include at least one of a silicon carbon nitride (SiCN) or a silicon oxide (SiOx); and
the second and fourth auxiliary films include a silicon nitride (SiNx).

14. The organic light emitting display device as claimed in claim 6, further comprising:
a first color filter in the first pixel area above the pixel layer with the quantum dot layer therebetween; and
a second color filter in the second pixel area above the pixel layer with the quantum dot layer therebetween, wherein the first color filter blocks the base light and transmits the first light, and the second color filter blocks the base light and transmits the second light.

15. The organic light emitting display device as claimed in claim 6, further comprising:
a color filter in the first and second pixel areas above the pixel layer with the quantum dot layer therebetween, wherein the color filter blocks the base light and transmits the first light and the second light.

16. The organic light emitting display device as claimed in claim 6, wherein the organic light emitting layer is a continuous film from the first to third pixel areas.

17. The organic light emitting display device as claimed in claim 1, further comprising:
a window assembly above the thin film encapsulation part with the quantum dot layer therebetween and exposed to the outside;
an adhesive layer between the thin film encapsulation part and the quantum dot layer; and
a second inorganic layer between the adhesive layer and the quantum dot layer.

18. The organic light emitting display device as claimed in claim 1, wherein the thin film encapsulation part covers the side parts of the pixel layer.

19. The organic light emitting display device as claimed in claim 1, wherein the second inorganic film is closer to the quantum dot layer than the first inorganic film.

20. The organic light emitting display device as claimed in claim 1, wherein:
the thin film encapsulation part includes a second inorganic film,
the first inorganic film selectively reflects light of a first color, and
the second inorganic film selectively reflects light of a second color, different from the first color.

21. The organic light emitting display device as claimed in claim 20, wherein the first color is green and the second color is red.

* * * * *